(12) United States Patent
Farkas et al.

(10) Patent No.: US 12,490,372 B2
(45) Date of Patent: Dec. 2, 2025

(54) SIGNAL SPEED INCREASE IN A CONNECTOR WIPE

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 316 days.

(21) Appl. No.: 18/361,864

(22) Filed: Jul. 30, 2023

(65) Prior Publication Data

US 2025/0040031 A1 Jan. 30, 2025

(51) Int. Cl.
*H05K 1/02* (2006.01)
*H05K 1/11* (2006.01)
*H05K 1/18* (2006.01)

(52) U.S. Cl.
CPC .......... *H05K 1/024* (2013.01); *H05K 1/0243* (2013.01); *H05K 1/025* (2013.01); *H05K 1/117* (2013.01); *H05K 1/181* (2013.01); *H05K 2201/10189* (2013.01)

(58) Field of Classification Search
CPC .............. H05K 1/024; H05K 1/025; H05K 2201/10189
See application file for complete search history.

(56) References Cited

U.S. PATENT DOCUMENTS

| | | | |
|---|---|---|---|
| 11,320,470 B2 | 5/2022 | Farkas et al. | |
| 11,367,979 B1* | 6/2022 | Huang | H01R 13/6474 |
| 2015/0245467 A1* | 8/2015 | Lim | H05K 3/403 |
| | | | 29/846 |
| 2018/0048094 A1* | 2/2018 | Cornelius | H01R 13/6473 |
| 2018/0261936 A1* | 9/2018 | Kawate | H01R 12/585 |
| 2021/0378094 A1 | 12/2021 | Chandra et al. | |

* cited by examiner

*Primary Examiner* — Sherman Ng
(74) *Attorney, Agent, or Firm* — Larson Newman, LLP

(57) ABSTRACT

A printed circuit board includes a dielectric and a connector. The dielectric has a first dielectric constant. A first area within the dielectric has a second dielectric constant. The connector is mounted on the dielectric. The connector includes a first connector lead mounted on the dielectric, a first contact point above the dielectric, and a first connector wipe. The first connector wipe is disposed above the first area.

14 Claims, 7 Drawing Sheets

SIGNAL SPEED INCREASE IN A CONNECTOR WIPE

CROSS-REFERENCE TO RELATED APPLICATION

Related subject matter is contained in co-pending U.S. patent application Ser. No. 18/361,868 entitled "REFLECTIVE CANCELLATIONS IN A CONNECTOR WIPE," filed of even date herewith, the disclosure of which is hereby incorporated by reference.

Related subject matter is contained in co-pending U.S. patent application Ser. No. 18/361,869 entitled "REFLECTIVE CANCELLATIONS IN A CONNECTOR WIPE OF A SURFACE MOUNT CONNECTOR," filed of even date herewith, the disclosure of which is hereby incorporated by reference.

FIELD OF THE DISCLOSURE

The present disclosure generally relates to information handling systems, and more particularly relates to signal speed increase in a connector wipe.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A printed circuit board includes a dielectric and a connector. The dielectric has a first dielectric constant. A first area within the dielectric has a second dielectric constant. The connector is mounted on the dielectric. The connector includes a first connector lead mounted on the dielectric, a first contact point above the dielectric, and a first connector wipe. The first connector wipe above the first area.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
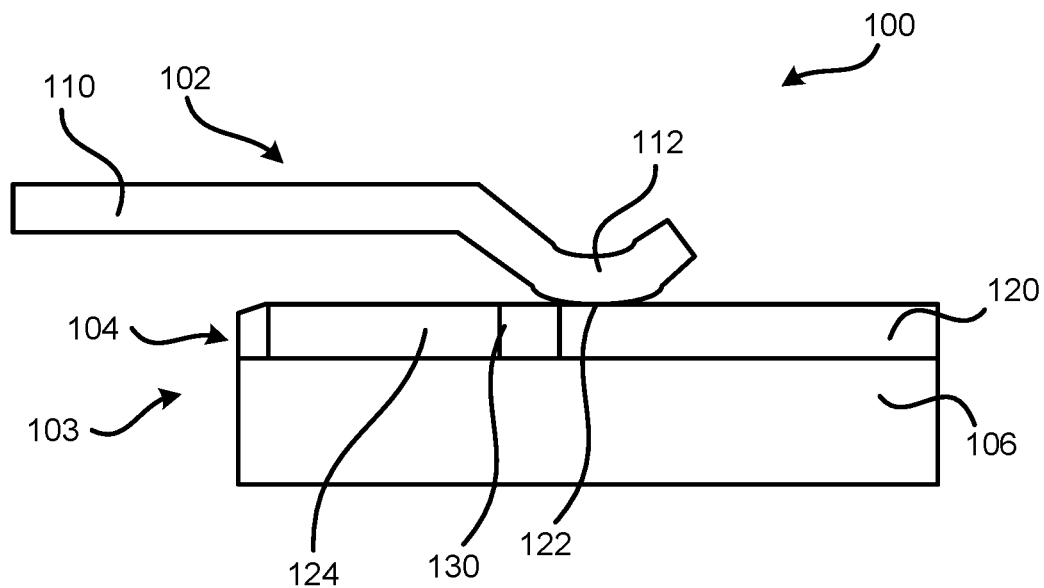
FIG. 1 is a diagram of a side view of a portion of a printed circuit board and a portion of a cable connector according to at least one embodiment of the present disclosure.
Figure 2:
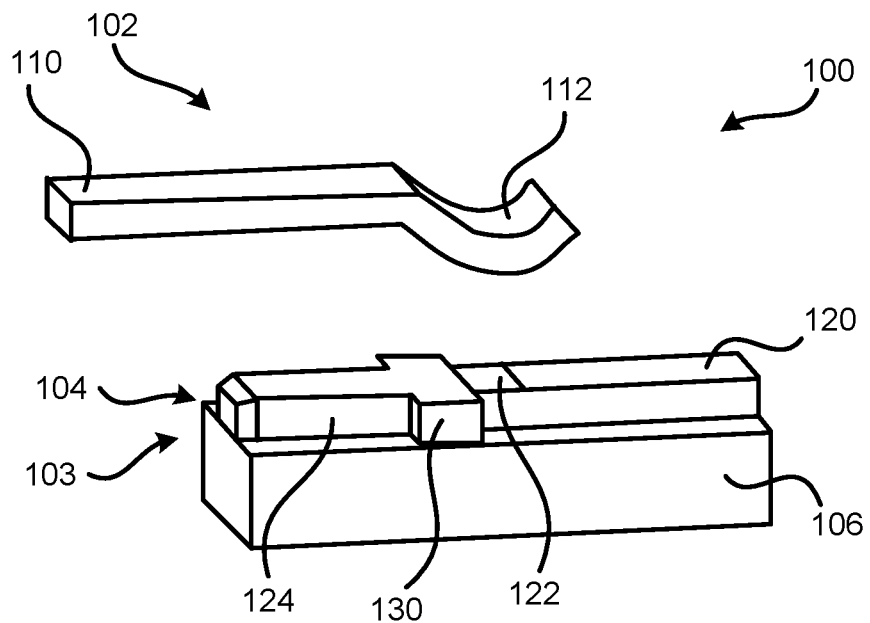
FIG. 2 is a diagram of a perspective view of a portion printed circuit board and a portion of a cable connector according to at least one embodiment of the present disclosure.

FIGS. 1 and 2 illustrate a portion of an information handling system 100 including a portion of a cable connector 102, and a portion of a printed circuit board 103 according to at least one embodiment of the present disclosure. The portion of information handling system 100 may be a portion of any suitable information handling system, such as information handling system 1100 of FIG. 11. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Printed circuit board 103 includes a connector 104 and dielectric 106. In an example, dielectric 106 may be a plastic body of a connector without varying from the scope of this disclosure. Cable connector 102 includes an extension portion 110 and a contact portion 112. Connector 104 includes a connector lead 120, a contact point 122, and a connector wipe 124. In an example, connector lead 120 may be a copper shape etched on printed circuit board 103 without varying from the scope of this disclosure. Connector wipe 124 includes a wider section 130. In an example, contact point 122 may be located between connector lead 120 and connector wipe 124. Wider section 130 may be adjacent to contact point 122. While cable connector 102 is described herein, any suitable connector, such as another board connector, may be utilized without varying from the scope of this disclosure. Information handling system 100 may include additional components without varying from the scope of this disclosure. Cable connector 102 may include additional components without varying from the scope of this disclosure. Printed circuit board 103 may include additional components without varying from the scope of this disclosure.

Figure 11:
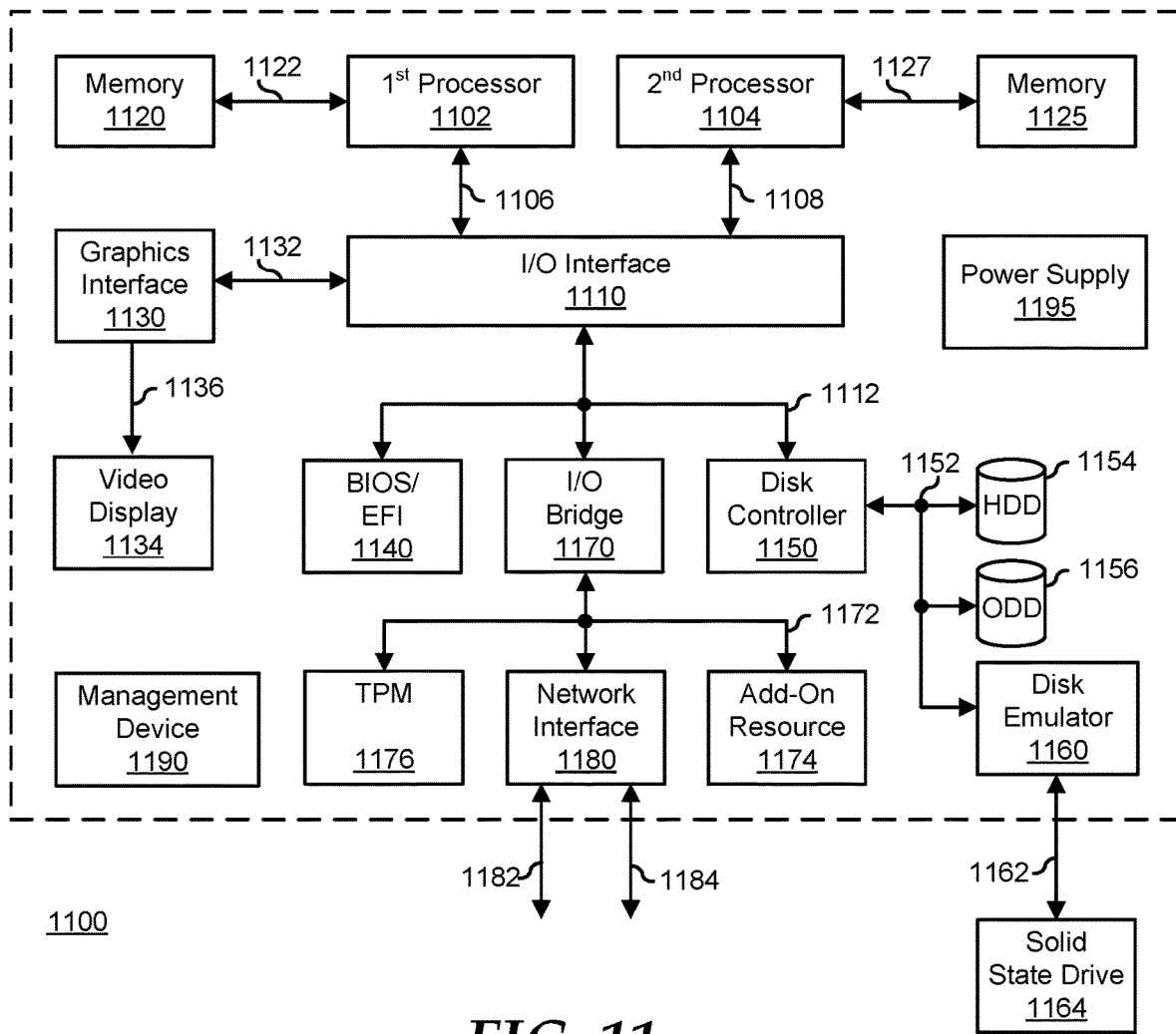
FIG. 11 is a block diagram of a general information handling system according to an embodiment of the present disclosure.

Large systems, such as information handling system 1100 of FIG. 11, may utilize board-to-board and board-to-cable connectors to connect subassemblies within the system. Connector wipe 124 may be utilized during the connection or mating of a connector, such as cable connector 102, and a printed circuit board, such as printed circuit board 103. A length of connector wipe 124 may control or affect whether the mating between cable connector 102 and printed circuit board 103 is reliable. In an example, the length of connector wipe may be any suitable length to ensure a reliable mating, such as a length greater than 1.5 mm. However, the longer the length of connector wipe 124, the worse signal integrity between cable connector 102 and printed circuit board 103. The signal integrity may be affected as any length of connector wipe 124 beyond contact point 122 may become a stub.

In an example, wider section 130 of connector wipe 124 may create an impedance mismatch between contact point 122 and the connector wipe. In this example, the impedance mismatch may prevent or discourage a substantial amount of a signal transmitted along connector lead 120 from entering connector wipe 124. In an example, the impedance mismatch may be created by wider section 130 having a lower impedance as compared to contact point 122. The lower impedance of wider section 130 may prevent a substantial amount of the signal from entering connector wipe 124. In an example, a higher dielectric constant, Dk, may be inserted with dielectric 106 below connector wipe 124 as will be described with respect to FIGS. 6-8 below.

Figure 3:
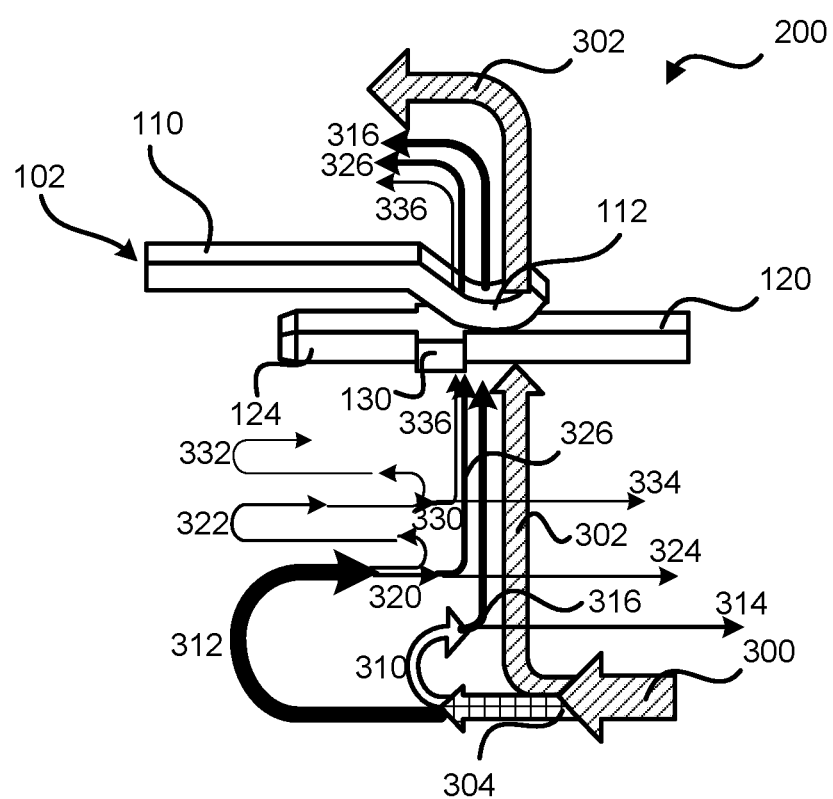
FIG. 3 is a diagram of representations of signal amplitudes through a portion of a printed circuit board and a portion of a cable connector according to at least one embodiment of the present disclosure.

FIG. 3 is a diagram of representations of signal amplitudes through connector lead 120, connector wipe 124, and cable connector 110 according to at least one embodiment of the present disclosure. While signals are transmitted along connector lead 120, cable connector 102, and connector wipe 124, the arrows in FIG. 3 are illustrated in locations not on the connector lead, the cable connector, and the connector wipe for clarity of illustration.

In previous cable-to-board connections or board-to-board connections of an information handling system, a signal transmitted along a connector lead may split at the contact point. In these previous connections, substantially half of the signal may travel up the intended path through the cable connector and the other half may travel into the connector wipe and reflect from the end of the connector wipe or stub. The reflected signal may split again at the contact point. In these previous connections, half of the reflected signal is transmitted along the connector lead towards the source and gets terminated. The other half of the reflected signal may be transmitted into the cable connector. However, in the previous connections the delayed and attenuated reflected signal may be added to the desired signal and cause signal integrity (SI) performance degradation. In an example, SI performance within information handling system 100 may be improved by wider section 130 of connector wipe 124 as will be described herein.

In an example, a high frequency signal 300 may be provided along connector lead 120 toward contact point 122. When signal 300 reaches contact point 122, the signal may split into signals 302 and 304. In an example, signal 302 may be transmitted from contact point 122 to contact portion 112 of cable connector 102. Signal 304 may be transmitted from contact point 122 into connector wipe 124. In certain examples, signal 304 may encounter wider section 130 of connector wipe 124, and the wider section may be a low impedance junction between contact point 122 and the connector wipe.

When signal 304 encounters the end of wider section 130, the signal may be split into signals 310 and 312. Signal 310 may reflect towards contact point 122, and signal 312 may continue down connector wipe 124 and reflect from the end of the connector wipe. Signal 310 may split into signals 314 and 316 at contact point 122. Signal 314 may be transmitted along connector lead 120 towards the source. Signal 316 may be transmitted from contact point 122 into contact portion 112 and through extension portion 110 of cable connector 102 to an endpoint. When signal 316 enters cable connector 102, the signal is added to signal 302. However, signal 316 may not cause SI integrity issues within signal 302 because the delay of signal 316 is very short.

In an example, after signal 312 is reflected from the end of connector wipe 124, the signal may split at wider section 130 into signals 320 and 322. At contact point 122, signal 320 may split into signals 324 and 326. Signal 324 may be transmitted along connector lead 120 towards the source. Signal 326 may be transmitted from contact point 122 into contact portion 112 and through extension portion 110 of cable connector 102 to an endpoint. When signal 326 enters cable connector 102, the signal is added to signal 302. However, signal 326 may not cause SI integrity issues within signal 302 because signal 326 is only a small portion of the original signal 300.

After signal 322 is reflected from the end of connector wipe 124, the signal may split at wider section 130 into signals 330 and 332. At contact point 122, signal 330 may split into signals 334 and 336. Signal 334 may be transmitted along connector lead 120 towards the source. Signal 336 may be transmitted from contact point 122 into contact portion 112 and through extension portion 110 of cable connector 102 to an endpoint. When signal 336 enters cable connector 102, the signal is added to signal 302. However, signal 336 may not cause SI integrity issues within signal 302 because signal 336 is only a small portion of the original signal 300. This back-and-forth bounce may continue until the signal on connector wipe 124 decays.

While the arrows in FIG. 3 are not drawn to scale, the arrow widths may represent signal strength or amplitude. Wider section 130 of connector wipe 124 may enable more of desired signals 300 and 316 and less of undesired signals 326 and 336. In this situation, wider section 130 may cause connector wipe 124 to look more lossy and increase the resonance frequency. In an example, the SI improvement within cable connector 102 and connector 104 may be optimized by selecting a proper geometry of the low impedance area or wider section 130 in connector wipe 124 to discourage the signals from crossing the low impedance boundary in both directions, and therefore maximize transmitted signals versus reflected signals. In certain examples, wider section 130 of connector wipe 124 may produce a higher resonance frequency, such as around 29%, as compared to previous connector wipes, and an effective stub reduction as compared to previous connector wipes, such as around 23%. In an example, the low impedance of wider section 130 may be included with a dielectric material change as described with respect to FIG. 8 below to make the stub reduction even more effective. Also, grooves, ferrite coating, or the like may be added to connector wipe 124 to make the stub reduction even more effective.

Figure 4:
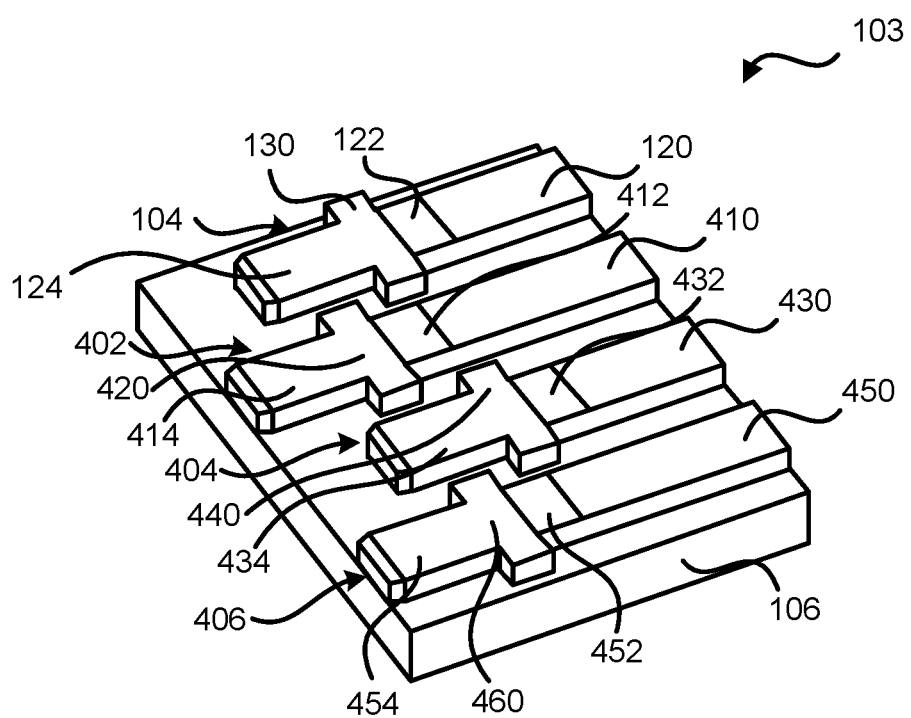
FIG. 4 is a diagram of a perspective view of a portion of a printed circuit board according to at least one embodiment of the present disclosure.
Figure 5:
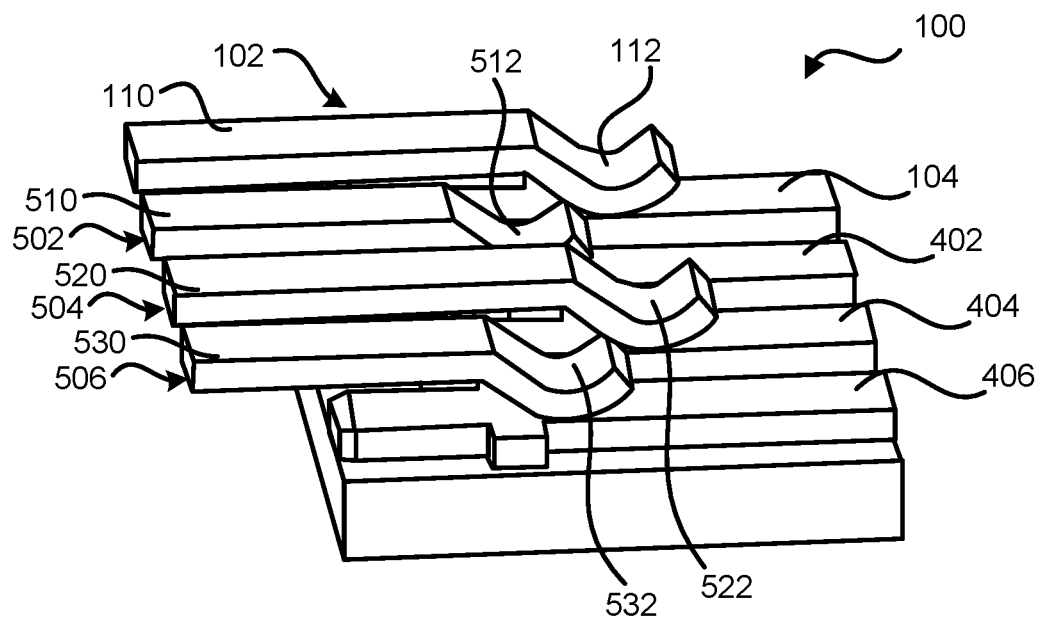
FIG. 5 is a diagram of a perspective view of a portion of a printed circuit board and a portion of a cable connector according to at least one embodiment of the present disclosure.

FIGS. 4 and 5 illustrate a portion printed circuit board 103 according to at least one embodiment of the present disclosure. Printed circuit board 103 may include additional connectors 402, 404, and 406 along with connector 104 and dielectric 106. Connector 104 includes connector lead 120, contact point 122, and connector wipe 124. Connector wipe 124 includes wider section 130. In an example, contact point 122 may be located between connector lead 120 and connector wipe 124, and wider section 130 may be adjacent to contact point 122. Similarly, connector 402 includes connector lead 410, contact point 412, and connector wipe 414. Connector wipe 414 includes wider section 420. In an example, contact point 412 may be located between connector lead 410 and connector wipe 414, and wider section 420 may be adjacent to contact point 412.

Connector 404 includes connector lead 430, contact point 432, and connector wipe 434. Connector wipe 434 includes wider section 440. In an example, contact point 432 may be located between connector lead 430 and connector wipe 434, and wider section 440 may be adjacent to contact point 432. Additionally, connector 406 includes connector lead 450, contact point 452, and connector wipe 454. Connector wipe 454 includes wider section 460. In an example, contact point 452 may be located between connector lead 450 and connector wipe 454, and wider section 460 may be adjacent to contact point 452.

In an example, the low impedance sections, such as wider sections 130, 420, 440, and 460, may cause connectors 104, 402, 404, and 406 slightly wider as compared to previous connectors on printed circuit boards. In certain examples, the amount space occupied by connectors 104, 402, 404, and 406 dielectric 106 may be minimized by staggering the connectors. Based on the staggering of connectors 104, 402, 404, and 406, wider sections 130, 420, 440, and 460 may be offset from adjacent wider sections. In an example, the offsetting of wider sections 130, 420, 440, and 460 may minimize coupling between connectors 104, 402, 404, and 406 and improve crosstalk.

Referring now to FIG. 5, cable connectors 102, 502, 504, and 506 may be placed in physical communication with respective connectors 104, 402, 404, and 406. Cable connector 102 includes extension portion 110 and contact portion 112. Cable connector 502 includes an extension portion 510 and a contact portion 512. Cable connector 504 includes an extension portion 520 and a contact portion 522. Cable connector 506 includes an extension portion 530 and a contact portion 532.

In an example, a different signal may be transmitted or provided along a different connector 104, 402, 404, and 406. A signal transmitted along connector 104 may enter cable connector 102 at contact portion 112 and travel through extension portion 110 to an endpoint. Similarly, a signal transmitted along connector 402 may enter cable connector 502 at contact portion 512 and travel through extension portion 510 to an endpoint. A signal transmitted along connector 404 may enter cable connector 504 at contact portion 522 and travel through extension portion 520 to an endpoint. A signal transmitted along connector 406 may enter cable connector 506 at contact portion 532 and travel through extension portion 530 to an endpoint.

Figure 6:
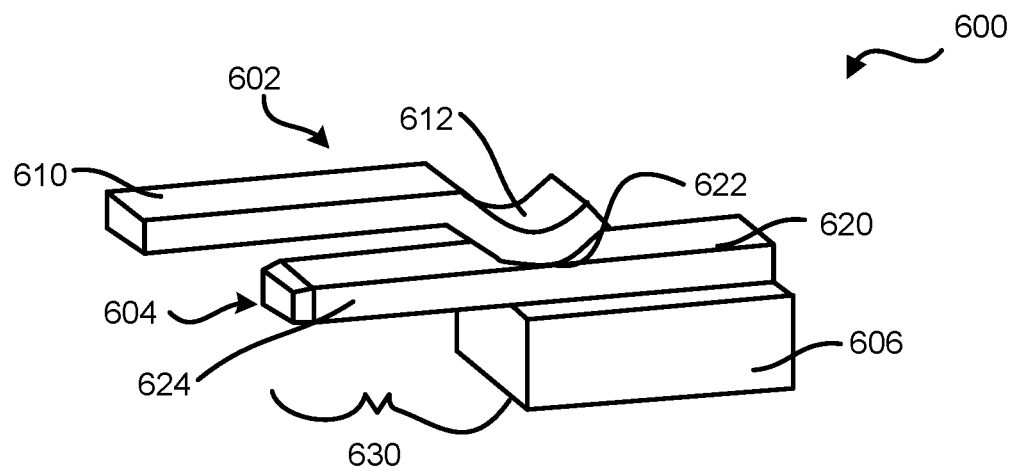
FIGS. 6-8 are diagrams of a perspective view of a portion of another printed circuit board and a portion of a cable connector according to at least one embodiment of the present disclosure.
Figure 7:
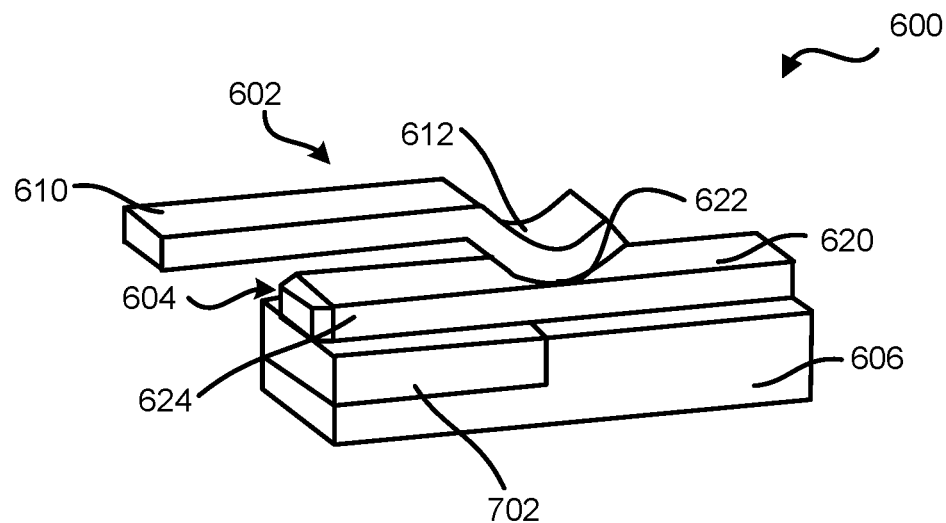
Figure 8:
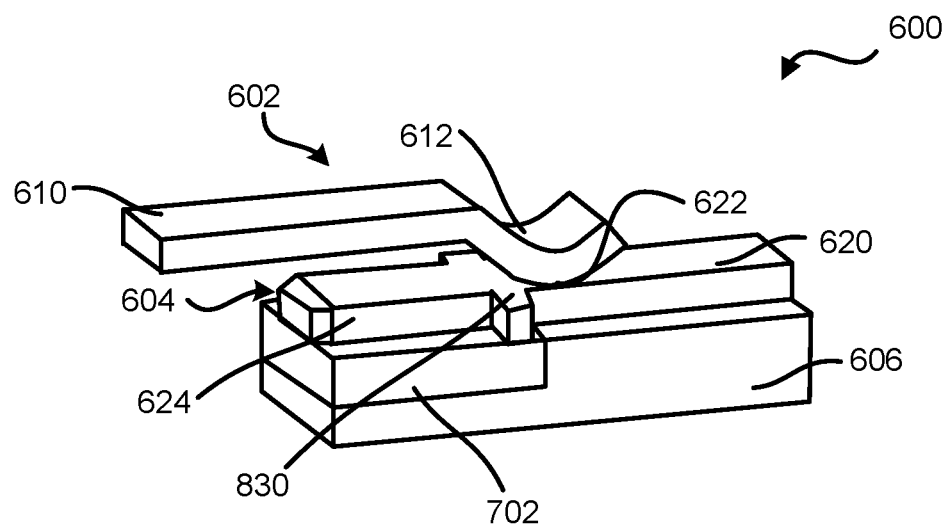

FIGS. 6-8 illustrate a portion printed circuit board 600 and a portion of cable connector 602 according to at least one embodiment of the present disclosure. Printed circuit board 600 includes a connector 604 and a dielectric 606. Cable connector 602 includes an extension portion 610 and a contact portion 612. Connector 604 includes a connector lead 620, a contact point 622, and a connector wipe 624. In an example, contact point 622 may be located between connector lead 620 and connector wipe 624. While only a single connector 604 and a single cable connector 602 are illustrated and described with respect to FIGS. 6-8, printed circuit board may include any suitable number of connectors 604 and any suitable number of cable connectors 602 may be in physical communication with the connectors similar to cable connectors 102, 502, 504, and 506 and respective connectors 104, 402, 404, and 406 illustrated in FIG. 5. Printed circuit board 600 may include additional components without varying from the scope of this disclosure.

In certain examples, any material or a void may be located below connector wipe 624 within area 630 of dielectric 606. In an example, the material or air within area 630 may have a lower dielectric constant, Dk, as compared to dielectric 606. FIG. 6 illustrates air being located in area 630 below connector wipe 624. FIG. 7 illustrates a different material 702 being located below connector wipe 624. FIG. 8 illustrates material 702 below connector wipe 624 and connector wipe including a wider section 830. In an example, wider section 830 may have a lower impedance as compared to connector lead 620 as described above with respect to FIGS. 1-3 above. In an example, dielectric 606 may include a different area 630 under each connector 604 of the printed circuit board, and each area may be a different material including air, material 702, or the like.

In certain examples, air within area 730 or material 702 may work in substantially the same manner to make connector wipe 624 to appear electrically shorter to a transmitted signal while still being mechanically long to enable reliable mating of cable connector 602 and connector 604. In an example, the lower dielectric constant of material 702 and air may result in higher signal propagation velocity and longer wavelength of a transmitted signal, which in turn may effectively shorten the stub length of connector wipe 624. For brevity and clarity, a change in signal propagation velocity and wavelength will be described with respect only to air, but similar changes to signal propagation velocity and wavelength may be produced based on material 702.

In an example, the signal propagation velocity of dielectric 606, $\varepsilon_{rd}$, may be any suitable value, such as 4, and the signal propagation velocity of air, $\varepsilon_{ra}$, may be any suitable value, such as 1. The signal propagation velocities of dielectric 606 and the air may be utilized to calculate a velocity factor, Vf, as shown in equation 1 below:

$$Vf = \sqrt{\varepsilon rd/\varepsilon ra} \qquad \text{EQ. 1}$$

Based on the example above, the velocity factor, Vf, may be 2. In an example, the new wavelength of the signal traveling on connector wipe 624 may be calculated based on the velocity factor, Vf, and the original wavelength of the signal. In this situation, the new wavelength may be 2 multiplied by the original wavelength.

In an example, the low dielectric constant pocket within area 630 may lower the combined propagation velocity, increase the speed of the signal, increase wavelength, and lower effective stub length of connector wipe 624 relative to wavelength by a factor of 2, and double useful frequency range of the signal. In certain examples, the combined dielectric constant of dielectric 606 and material 702 or combined dielectric constant of the dielectric and air may be greater than 1, and the stub reduction effect is less than 2×.

Figure 9:
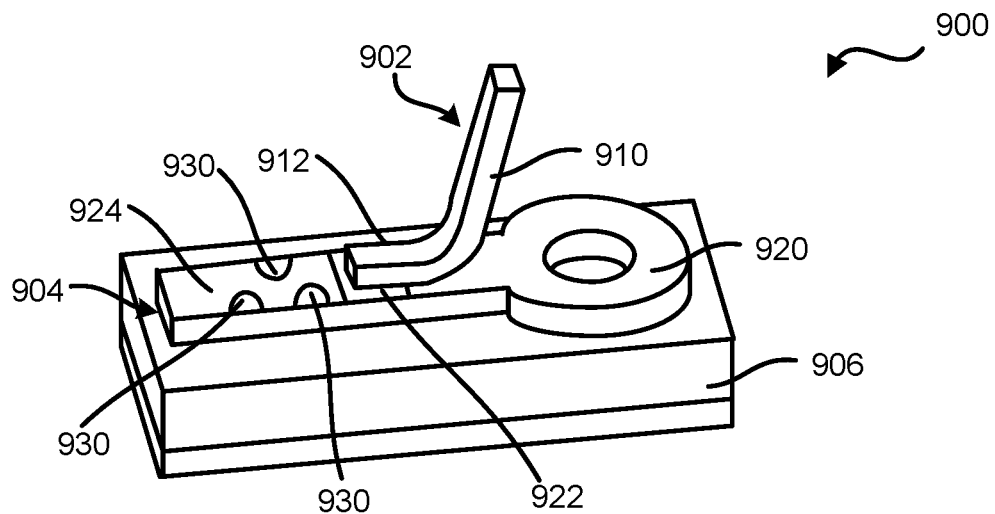
FIGS. 9 and 10 are diagrams of a perspective view of a portion of another printed circuit board and a portion of a cable connector according to at least one embodiment of the present disclosure.
Figure 10:
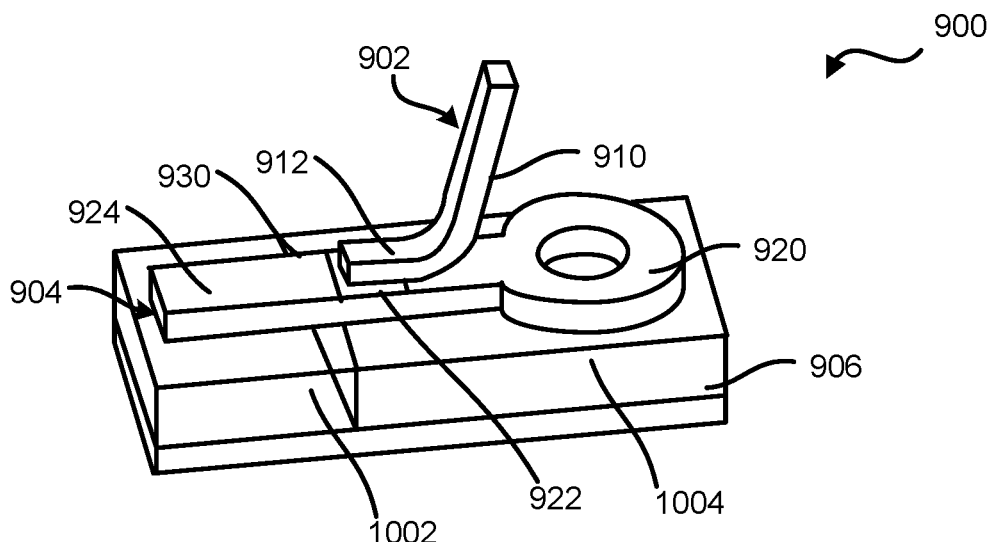

FIGS. 9 and 10 illustrate a portion printed circuit board 900 and a portion of cable connector 902 according to at least one embodiment of the present disclosure. Printed circuit board 900 includes a connector 904 and a dielectric 906. Cable connector 902 includes an extension portion 910 and a contact portion 912. Connector 904 includes a connector lead 920, a contact point 922, and a connector wipe 924. In an example, contact point 922 may be located between connector lead 920 and connector wipe 924. In an example, connector lead 920 may be a via and cable connector 902 may be a surface mount component. In an example, connector lead 920 may be a via and cable connector 902 may be a surface mount component. While only a single connector 904 and a single cable connector 902 are illustrated and described with respect to FIGS. 9 and 10, printed circuit board may include any suitable number of connectors 904 and any suitable number of cable connectors 902 may be in physical communication with the connectors similar to cable connectors 102, 502, 504, and 506 and respective connectors 104, 402, 404, and 406 illustrated in FIG. 5. Printed circuit board 900 may include additional components without varying from the scope of this disclosure.

In an example, connector wipe 924 may include any suitable number of low impedance bumps 930. In this example, low impedance bumps 930 may create an impedance mismatch between contact point 922 and connector wipe 924 in a substantially similar manner as described above with respect to FIGS. 1-3 above. For example, low impedance bumps 930 may cause damping, and velocity and wavelength changes in signals reflected from the end of connector wipe 924 in a substantially similar manner as described above with respect to FIG. 3.

In an example, low impedance bumps 930 may result in connector wipe 924 appearing shorten to signal transmitted along connector 904. In certain examples, connector 104 of FIG. 1, connectors 402, 404, and 406 of FIG. 4, connector 604 of FIGS. 6-8, and connector 904 of FIGS. 9 and 10 may be any suitable connector, such as a component pad for a peripheral component interconnect express (PCIe) slot or dual inline memory module (DIMM) slot.

Referring now to FIG. 10, dielectric 906 may include a void 1002 under connector wipe 924, and a ground plane 1004 under connector lead 920 and contact point 922. In example, ground plane 1004 may provide a necessary ground for signals transmitted along connector lead 920 and contact point 922. Connector lead 920, contact point 922, and ground plane 1004 may from any suitable communication pad, such as a DIMM or PCIE pad. In certain examples, connector 904 may have both low impedance bumps 930 within connector wipe 924 and void 1002 below the connector wipe 924. In an example, void 1002 may create a lower impedance point under connector wipe 924. In this example, the low impedance point from void 1002 may create an impedance mismatch between contact point 922 and connector wipe 924 in a substantially similar manner as described above with respect to FIG. 3. In an example, void 1002 may increase the impedance under connector wipe 924, which in turn may increase the combined propagation velocity, increase the speed of the signal, increase wavelength, and lower effective stub length of connector wipe 924.

FIG. 11 shows a generalized embodiment of an information handling system 1100 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1100 can include processing resources for executing machine-executable code, such as a central processing unit (CPU), a programmable logic array (PLA), an embedded device such as a System-on-a-Chip (SoC), or other control logic hardware. Information handling system 1100 can also include one or more computer-readable medium for storing machine-executable code, such as software or data. Additional components of information handling system 1100 can include one or more storage devices that can store machine-executable code, one or more communications ports for communicating with external devices, and various input and output (I/O) devices, such as a keyboard, a mouse, and a video display. Information handling system 1100 can also include one or more buses operable to transmit information between the various hardware components.

Information handling system 1100 can include devices or modules that embody one or more of the devices or modules described below and operates to perform one or more of the methods described below. Information handling system 1100 includes a processors 1102 and 1104, an input/output (I/O) interface 1110, memories 1120 and 1125, a graphics interface 1130, a basic input and output system/universal extensible firmware interface (BIOS/UEFI) module 1140, a disk controller 1150, a hard disk drive (HDD) 1154, an optical disk drive (ODD) 1156, a disk emulator 1160 connected to an external solid state drive (SSD) 1164, an I/O bridge 1170, one or more add-on resources 1174, a trusted platform module (TPM) 1176, a network interface 1180, a management device 1190, and a power supply 1195. Processors 1102 and 1104, I/O interface 1110, memory 1120, graphics interface 1130, BIOS/UEFI module 1140, disk controller 1150, HDD 1154, ODD 1156, disk emulator 1160, SSD 1164, I/O bridge 1170, add-on resources 1174, TPM 1176, and network interface 1180 operate together to provide a host environment of information handling system 1100 that operates to provide the data processing functionality of the information handling system. The host environment operates to execute machine-executable code, including platform BIOS/UEFI code, device firmware, operating system code, applications, programs, and the like, to perform the data processing tasks associated with information handling system 1100.

In the host environment, processor 1102 is connected to I/O interface 1110 via processor interface 1106, and processor 1104 is connected to the I/O interface via processor interface 1108. Memory 1120 is connected to processor 1102 via a memory interface 1122. Memory 1125 is connected to processor 1104 via a memory interface 1127. Graphics interface 1130 is connected to I/O interface 1110 via a graphics interface 1132 and provides a video display output 1136 to a video display 1134. In a particular embodiment, information handling system 1100 includes separate memories that are dedicated to each of processors 1102 and 1104 via separate memory interfaces. An example of memories 1120 and 1125 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1140, disk controller 1150, and I/O bridge 1170 are connected to I/O interface 1110 via an I/O channel 1112. An example of I/O channel 1112 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 1110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 1140 includes BIOS/UEFI code operable to detect resources within information handling system 1100, to provide drivers for the resources, initialize the resources, and access the resources. BIOS/UEFI module 1140 includes code that operates to detect resources within information handling system 1100, to provide drivers for the resources, to initialize the resources, and to access the resources.

Disk controller 1150 includes a disk interface 1152 that connects the disk controller to HDD 1154, to ODD 1156, and to disk emulator 1160. An example of disk interface 1152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1160 permits SSD 1164 to be connected to information handling system 1100 via an external interface 1162. An example of external interface 1162 includes a USB interface, an IEEE 4394 (Firewire) interface, a proprietary interface, or a combination thereof. Alternatively, solid-state drive 1164 can be disposed within information handling system 1100.

I/O bridge 1170 includes a peripheral interface 1172 that connects the I/O bridge to add-on resource 1174, to TPM 1176, and to network interface 1180. Peripheral interface 1172 can be the same type of interface as I/O channel 1112 or can be a different type of interface. As such, I/O bridge 1170 extends the capacity of I/O channel 1112 when peripheral interface 1172 and the I/O channel are of the same type, and the I/O bridge translates information from a format suitable to the I/O channel to a format suitable to the peripheral channel 1172 when they are of a different type. Add-on resource 1174 can include a data storage system, an additional graphics interface, a network interface card (NIC), a sound/video processing card, another add-on resource, or a combination thereof. Add-on resource 1174 can be on a main circuit board, on separate circuit board or add-in card disposed within information handling system 1100, a device that is external to the information handling system, or a combination thereof.

Network interface 1180 represents a NIC disposed within information handling system 1100, on a main circuit board of the information handling system, integrated onto another component such as I/O interface 1110, in another suitable location, or a combination thereof. Network interface device 1180 includes network channels 1182 and 1184 that provide interfaces to devices that are external to information handling system 1100. In a particular embodiment, network channels 1182 and 1184 are of a different type than peripheral channel 1172 and network interface 1180 translates information from a format suitable to the peripheral channel to a format suitable to external devices. An example of network channels 1182 and 1184 includes InfiniBand channels, Fibre Channel channels, Gigabit Ethernet channels, proprietary channel architectures, or a combination thereof. Network channels 1182 and 1184 can be connected to external network resources (not illustrated). The network resource can include another information handling system, a data storage system, another network, a grid management system, another suitable resource, or a combination thereof.

Management device 1190 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 1100. In particular, management device 1190 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 1100, such as system cooling fans and power supplies. Management device 1190 can include a network connection to an external management system, and the management device can communicate with the management system to report status information for information handling system 1100, to receive BIOS/UEFI or system firmware updates, or to perform other task for managing and controlling the operation of information handling system 1100.

Management device 1190 can operate off of a separate power plane from the components of the host environment so that the management device receives power to manage information handling system 1100 when the information handling system is otherwise shut down. An example of management device 1190 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1190 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A printed circuit board comprising:
   a dielectric having a first dielectric constant;
   a first area within the dielectric having a second dielectric constant; and
   a connector mounted on the dielectric, the connector including a first connector lead mounted on the dielectric, a first contact point above the dielectric, and a first connector wipe, the first connector wipe disposed above the first area, wherein a first portion of a signal transmitted along the connector lead is provided to a contact in physical communication with the first contact point and a second portion of the signal is provided along the first connector wipe, wherein a first signal propagation velocity for the first portion of the signal along the contact is slower than a second signal propagation velocity for the second portion of the signal along the first connector wipe.

2. The printed circuit board of claim 1, wherein air is located within the first area.

3. The printed circuit board of claim 1, wherein a material different from the dielectric is located within the first area.

4. The printed circuit board of claim 1, wherein the second dielectric constant is lower than the first dielectric constant.

5. The printed circuit board of claim 1, wherein the first contact point is located between the first connector lead and the first connector wipe.

6. An information handling system comprising:
   a cable connector having an extension portion and a contact portion; and
   a printed circuit board including:
   a dielectric having a first dielectric constant;
   a first area within the dielectric having a second dielectric constant; and
   a connector mounted on the dielectric, the connector including a first connector lead mounted on the dielectric, a first contact point above the dielectric, and a first connector wipe, the first connector wipe disposed above the first area, wherein a first portion of a signal transmitted along the connector lead is provided to a contact in physical communication with the first contact point and a second portion of the signal is provided along the first connector wipe, and wherein a first signal propagation velocity for the first portion of the signal along the contact is slower than a second signal propagation velocity for the second portion of the signal along the first connector wipe.

7. The information handling system of claim 6, wherein the first connector wipe is a stub extending beyond the first contact point.

8. The information handling system of claim 6, wherein air is located within the first area.

9. The information handling system of claim 6, wherein a material different from the dielectric is located within the first area.

10. The information handling system of claim 6, wherein the first contact point is located between the first connector lead and the first connector wipe.

11. The information handling system of claim 6, wherein the second dielectric constant is lower than the first dielectric constant.

12. A printed circuit board comprising:
    a dielectric having a first dielectric constant;
    an area within the dielectric having a second dielectric constant; and
    a connector mounted on the dielectric, the connector including a first connector lead mounted on the dielectric, a first contact point above the dielectric, and a first connector wipe, the first connector wipe disposed above the area, wherein the second dielectric constant is lower than the first dielectric constant, wherein a first portion of a signal transmitted along the connector lead is provided to a contact in physical communication with the first contact point and a second portion of the signal is provided along the first connector wipe, wherein a first signal propagation velocity for the first portion of the signal along the contact is slower than a second signal propagation velocity for the second portion of the signal along the first connector wipe.

13. The printed circuit board of claim 12, wherein air is located within the area.

14. The printed circuit board of claim 12, wherein a material different from the dielectric is located within the area.

\* \* \* \* \*